United States Patent [19]
Hintermaier et al.

[11] Patent Number: 6,126,998
[45] Date of Patent: Oct. 3, 2000

[54] PROCESS FOR PRODUCING A CERAMIC LAYER CONTAINING BI

[75] Inventors: Frank Hintermaier, Munich; Carlos Mazure-Espejo, Zorneding, both of Germany

[73] Assignee: Siemens Aktiengesellschaft, Munich, Germany

[21] Appl. No.: 09/164,119

[22] Filed: Sep. 30, 1998

[30] Foreign Application Priority Data

Sep. 30, 1997 [DE] Germany .......................... 197 43 269

[51] Int. Cl.[7] ........................................... B05D 3/02
[52] U.S. Cl. .................. 427/376.2; 427/79; 427/126.3
[58] Field of Search ................... 427/79, 126.2, 427/126.3, 376.2

[56] References Cited

U.S. PATENT DOCUMENTS

| | | | |
|---|---|---|---|
| 5,077,265 | 12/1991 | Ritter | 505/1 |
| 5,468,679 | 11/1995 | Paz De Araujo et al. | 437/110 |
| 5,480,862 | 1/1996 | Miszenti . | |
| 5,508,226 | 4/1996 | Ito et al. . | |
| 5,683,614 | 11/1997 | Boyle | 252/62.9 R |
| 5,811,153 | 9/1998 | Hashimoto et al. | 427/58 |

FOREIGN PATENT DOCUMENTS

| | | |
|---|---|---|
| 0 646 974 A1 | 4/1995 | European Pat. Off. . |
| 0 760 400 A2 | 3/1997 | European Pat. Off. . |
| 0 877 100 A1 | 11/1998 | European Pat. Off. . |
| 3-295808 | 12/1991 | Japan . |
| 8-325019 | 12/1996 | Japan . |

OTHER PUBLICATIONS

Japanese Patent Abstract No. 03295808 (Yuichi), dated Dec. 26, 1991.
Derwent Abstract XP–002090880, 1993.
International Publication No. WO 93/12538 (Paz de Araujo et al.), dated Jun. 24, 1993.
"Formation of $SrBi_2Ta_2O_9$: Part I. Synthesis and characterization of a novel "sol–gel" solution for production of ferroelectric $SrBi_2Ta_2O_9$ thin films" (Boyle et al.), 1996 Materials Research Society, vol. 11, No. 9, pp. 2274–2281.

*Primary Examiner*—Diana Dudash
*Assistant Examiner*—Michael Barr
*Attorney, Agent, or Firm*—Herbert L. Lerner; Laurence A. Greenberg; Werner H. Stemer

[57] ABSTRACT

A process for producing a ceramic layer containing Bi, in particular having ferroelectric, dielectric or superconducting properties, includes using only an organic acid $C_nH_{2n+1}$COOH wherein n=0, 1 or 2 and, where appropriate, water, as a solvent for the precursor containing Bi.

11 Claims, 3 Drawing Sheets

PROCESS FOR PRODUCING A CERAMIC LAYER CONTAINING BI

BACKGROUND OF THE INVENTION

Field of the Invention

The invention relates to a process for producing a ceramic layer containing Bi as a component, from at least two precursors, on a substrate, in particular a ceramic layer having ferroelectric, paraelectric or superconducting properties.

In semiconductor technology, increasing interest is being shown in the use of ceramic thin films. That group of substances includes compounds having superconducting, ferroelectric or dielectric properties with a high dielectric constant. The latter two groups of compounds are, in particular, advantageous for use as a storage dielectric in capacitors of an integrated circuit. The ceramic substances are oxides which have at least two components, besides oxygen. Examples of the components include Ba, Sr, Bi, Pb, Zr, La, Ti and Ta.

One example of a semiconductor circuit having a capacitor is a DRAM storage cell. In order to increase the integration density, the cell may be produced in the form of a so-called stacked capacitor cell, in which the storage capacitor is disposed above the associated selection transistor. Among other things, the choice of the capacitor dielectric has an essential effect on the space required for a capacitor of that type.

Conventional capacitors mostly use layers of silicon oxide or nitride, which have a dielectric constant of at most 8, as the storage dielectric. The paraelectric materials in that group of substances, for example BST (barium strontium titanate, $(BaSr)TiO_3$) and the like have a dielectric constant $\epsilon > 150$ and therefore allow a smaller capacitor to be used for an equal capacitance.

Storage elements of that type, having a paraelectric material as the capacitor dielectric (DRAMs) lose their charge, and therefore their stored information, when the supply voltage is interrupted. Furthermore, because of the residual leakage current, conventional storage elements need to be continually refreshed (refresh time). Due to the different polarization directions, the use of a ferroelectric material as a storage dielectric permits the construction of a non-volatile memory, which does not lose its information when the supply voltage is interrupted and does not need to be refreshed constantly. The residual leakage current of the cell does not affect the stored signal. Examples of a ferroelectric material of that type from that group of substances include PZT (lead zirconium titanate, $Pb(Zr,Ti)O_3$) and SBT (strontium bismuth tantalate, $SrBi_2Ta_2O_9$).

Since the production of those new ferroelectrics and paraelectrics generally takes place at high temperatures in an oxidizing atmosphere, a material compatible with those conditions is needed, in particular, for the first capacitor electrode. Pt, Ru, $RuO_2$ or a similar material is conventionally used.

There are three essential methods known for the production of ceramic thin films: a sputtering process, a CVD process and a so-called sol-gel process. In the sol-gel process, metalorganic starting chemicals are generally dissolved in a nonpolar aromatic solvent (for example in xylene), then the solution is applied to the wafer and spun (spin-on process). The thin film of metalorganic molecules which is obtained in that way is subsequently converted into an oxide film in the presence of oxygen. That oxide film is transformed into the phase with the desired electrical properties during a subsequent heat treatment, which in the case of SBT is typically carried out in a temperature range of from 700 to 800° C. In the case of an SBT layer, a lamellar perovskite phase with ferroelectric properties is formed, while BST or PZT involve a simple perovskite (heat treatment at 450–650° C.).

An example of a sol-gel process of that type is described in International Publication No. WO 93/12538. In that production process, the use of the usual solvents, in particular the nonpolar aromatic solvents, causes problems because of the toxicity and potential carcinogenic nature of the vapors.

A production process for SBT is also described in an article entitled "Formation of $SrBi_2Ta_2O_9$: Part I. Synthesis and Characterization of a Novel "Sol-Gel" Solution for Production of Ferroelectric $SrBi_2Ta_2O_9$ Thin Films", by T. Boyle et al., in Journal of Material Research, Vol. 11, No. 9, September 1996, pages 2274 to 2281. In that case, the precursor containing Ta and the precursor containing Sr are dissolved in acetic acid. The article states that the precursor containing Bi is insoluble in acetic acid, and must therefore be dissolved in pyridine. A disadvantage with that process is the outlay due to the unavoidable use of two different starting solutions, which are mixed immediately before the wafer is coated. There is also the problem of aging of the starting solution containing the acetic acid. In that solution, the precursor containing Ta (tantalum ethoxide) reacts with the acetic acid to form ethyl acetate and water. The water hydrolyzes the precursor containing Ta, with the result that tantalum oxide clusters with high molecular weight are formed. Over the course of time, a colloidal and later suspended $Ta_2O_5$ is produced, which can be detected by a change in viscosity after about 1 week and turbidity after about 2 weeks. It is consequently not possible to store the precursor containing Ta in acetic acid for long periods of time.

SUMMARY OF THE INVENTION

It is accordingly an object of the invention to provide a simple process for producing a ceramic layer that contains Bi as a component, on a substrate, which overcomes the hereinafore-mentioned disadvantages of the heretofore-known methods of this general type.

With the foregoing and other objects in view there is provided, in accordance with the invention, a process for producing a ceramic layer containing Bi as a component, from at least two precursors on a substrate, which comprises using only an organic acid $C_nH_{2n+1}COOH$, where n=0, 1 or 2 and, where appropriate, water, as a solvent for the precursor containing Bi; dissolving a further precursor in a further solvent and/or providing a further precursor in a liquid state; then applying the dissolved and, where appropriate, liquid precursor to the substrate; and then producing the layer by heating.

According to the invention, an organic acid $C_nH_{2n+1}$COOH, wherein n=0, 1 or 2, that is to say methanoic acid, acetic acid or propionic acid, is used as a solvent for the precursor containing Bi. It has surprisingly been found that, in contradiction to the article by Boyle et al., the customary precursors, in particular including precursors containing Bi, are soluble in these acids. When the precursors were combined and, for example, added to acetic acid, good solubility was observed. This may be attributed to cooperative effects of the individual precursors, for example through altering the polarity of the acetic acid by one precursor or by interactions of the precursors with one another. The solubility can be improved further by the addition of water. The dissolved precursors are then applied to the substrate in a spin-on process, the film is dried and annealed at high temperatures, typically >250° C.

According to a further refinement of the invention, the problem of the lack of long-term stability can also be solved. In the aforementioned example of SBT, the precursor containing Bi and the precursor containing Sr are dissolved in acetic acid, for example. This solution L1 is stable, and none of the precursors react chemically with the acetic acid. Further increased long-term stability can be achieved by the addition of water (L2). The precursor containing Ta can then be added to it in two different ways:

(a) The existing solution L1 or L2 is heated to a temperature which lies above the melting point of the precursor containing Ta. Immediately before the coating, the described solution and the liquid precursor containing Ta are mixed. It is necessary to heat the whole system to a temperature above the melting temperature described. The solution and the liquid precursor containing Ta are intimately mixed directly, with it being necessary in the case of a solution containing water (L2) for the mixing to be carried out quickly in order to reduce the concentration of the precursor containing Ta quickly and thus prevent rapid coagulation of the hydrolysis product. The mixture obtained is applied to the substrate using the spin-on process.

(b) It is also possible to dissolve the precursor containing Ta in a different solvent, and then to mix this mixture with L1 or L2 in the mixer. When L2 is used, the mixing should be carried out quickly, as described under (a). The advantage of this variant is that local excess concentrations of the precursor containing Ta during the mixing are avoided, and the risk of hydrolysis is thus reduced. Furthermore, heating is not necessary. Suitable solvents are substances which do not react with the precursor to form water. One example is tetrahydrofuran (THF), which only has a small potential health risk.

A fundamental advantage of the present invention is the use of the non-toxic acid as a solvent for the precursor containing Bi and, where appropriate, other precursors. This entails fewer protective measures and makes waste disposal more straightforward. A further advantage of the acids is that, because of their polarity, not only are they capable of dissolving the heretofore used metallorganic chemicals, but they are also capable of dissolving other compounds of less complex structure. A broad spectrum of starting chemicals is therefore available. The heretofore used metallorganic chemicals also have the disadvantages that, on one hand, they are not always readily available on the market and, on the other hand, they can often only be obtained with a low degree of purity. Those advantages also lead to a reduction in cost.

Suitable precursors in many cases are the acetates or oxides of the metals, but it is also possible for the metals, in particular Sr, to be dissolved directly in the acid. The compounds $Ta(OEt)_4(acac)$, $Ta(OEt)_5$ or $Ta(OMe)_5$ may be used as the precursor containing Ta.

Other features which are considered as characteristic for the invention are set forth in the appended claims.

Although the invention is illustrated and described herein as embodied in a process for producing a ceramic layer containing Bi, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
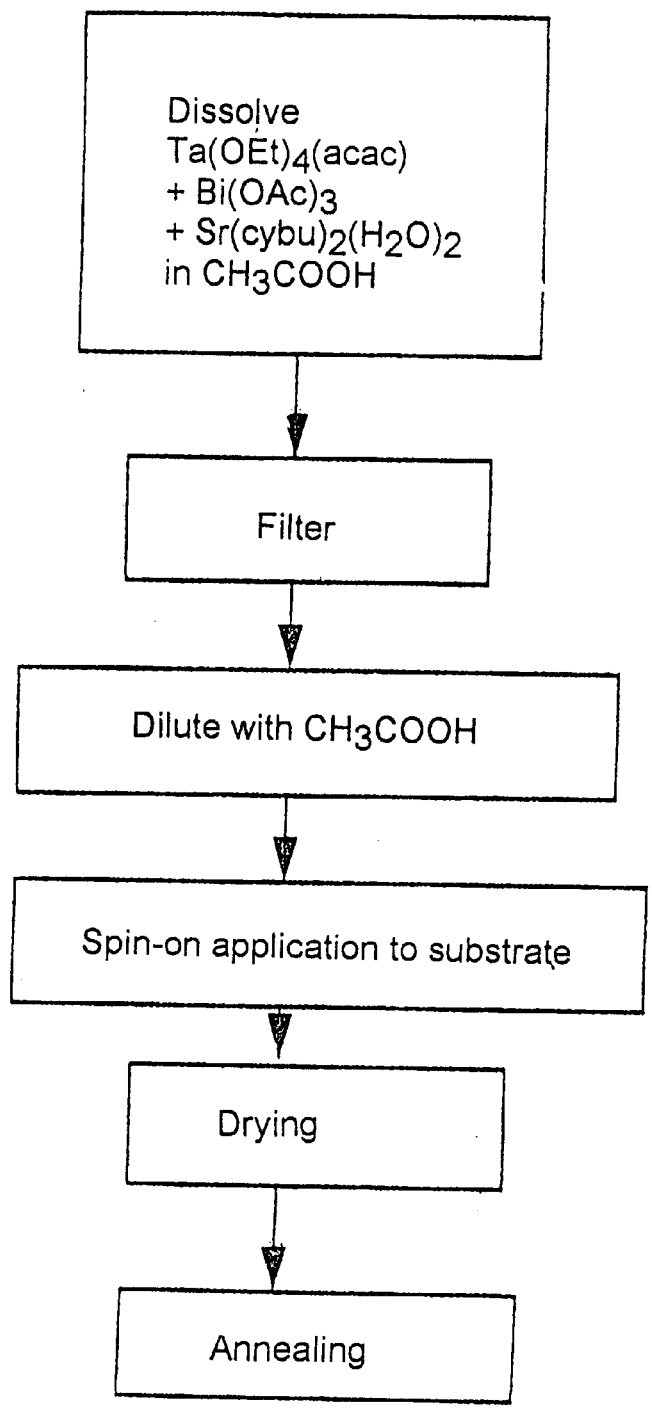
FIGS. 1 and 2 are flow charts for a process according to the invention.

Referring now to the figures of the drawings in detail and first, particularly, to FIG. 1 thereof, there is seen a first illustrative embodiment, in which the following precursors are used for the production of SBT:

$Ta(OEt)_4(acac)$ as Ta precursor, $Bi(OAc)_3$ as Bi precursor and $Sr(cybu)_2(H_2O)_2$ as Sr precursor (where OEt=ethoxide, acac=acetyl acetonate, OAc=acetate, cybu=cyclohexyl butyrate).

3.012 g of the Ta precursor, 2.552 g of the Bi precursor and 1.451 g of the Sr precursor are dissolved in 13.880 g of acetic acid while heating. After cooling, the solution is filtered through a 0.2 μm filter and further solutions can be obtained from the stock solution obtained in this way by diluting with acetic acid. The solution is applied to the substrate and spun at about 2500 rpm for 1 min. The layer is then dried by heating it to 100° C. within 30 min. The pyrolysis is carried out at about 460° C. in air, for example in a blast furnace, and typically lasts 8 hours. The temperature is preferably stepped up at 60° C./h in order to avoid evaporation of the Bi precursor. A variety of SBT layer thicknesses are obtained depending on the degree to which the stock solution is diluted. The undiluted stock solution gives a layer thickness of about 200 nm, on a substrate formed of platinum. The reduction in the achieved layer thickness due to dilution of the stock solution with acetic acid is represented in the following table (substrate=Pt).

| Solution | Amount of stock solution [g] | Amount of acetic acid added [g] | Layer thickness [nm, ±5 nm] |
|---|---|---|---|
| 1 | Stock solution | — | 200 |
| 2 | 0.582 | 0.014 | 195 |
| 3 | 0.587 | 0.027 | 190 |
| 4 | 0.578 | 0.040 | 185 |
| 5 | 0.582 | 0.050 | 180 |
| 6 | 0.584 | 0.056 | 175 |
| 7 | 0.577 | 0.070 | 170 |
| 8 | 0.583 | 0.082 | 160 |
| 9 | 0.579 | 0.106 | 155 |
| 10 | 0.582 | 0.122 | 150 |
| 11 | 0.575 | 0.132 | 145 |
| 12 | 0.581 | 0.155 | 140 |
| 13 | 0.581 | 0.164 | 135 |
| 14 | 0.587 | 0.184 | 130 |
| 15 | 0.582 | 0.203 | 125 |
| 16 | 0.586 | 0.221 | 120 |
| 17 | 0.578 | 0.245 | 115 |
| 18 | 0.575 | 0.282 | 110 |
| 19 | 0.581 | 0.294 | 105 |
| 20 | 0.580 | 0.333 | 100 |

-continued

| Solution | Amount of stock solution [g] | Amount of acetic acid added [g] | Layer thickness [nm, ±5 nm] |
|---|---|---|---|
| 21 | 0.578 | 0.359 | 100 |
| 22 | 0.583 | 0.378 | 95 |
| 23 | 0.585 | 0.416 | 90 |
| 24 | 0.577 | 0.449 | 90 |
| 25 | 0.577 | 0.491 | 85 |
| 26 | 0.582 | 0.536 | 85 |

If $SiO_2$ is used as the substrate, then thick solutions give rise to greater layer thicknesses, for example a thickness of 220 nm in the case of the stock solution. No increase in the layer thickness is observed with thin solutions.

A greater layer thickness can be achieved with the following stock solution: 2.768 g of the Ta precursor, 2.345 g of the Bi precursor, 1.334 g of the Sr precursor and 10.629 g of acetic acid. A layer thickness of 280 nm is achieved on a Pt substrate with this stock solution. In this case as well, the layer thickness can be reduced by diluting the stock solution with acetic acid. For example, a layer thickness of 245 nm is achieved with a mixture made up of 0.7 g of stock solution and 0.038 g of acetic acid.

Larger layer thicknesses may also be achieved by repeated spin application and drying.

The process described above can be used to produce an SBT layer having ferroelectric properties. A problem arises, however, with regard to aging of the solution, to be precise a change in the viscosity after about 1 week and turbidity after about 2 weeks, which may be attributed to hydrolysis of the precursor containing Ta, as described above. The problem of aging can be avoided without the need to use hazardous solvents or precursors with a complex structure, with the second embodiment of the invention described below. The second embodiment is likewise explained with reference to the example of producing an SBT film.

Figure 2:
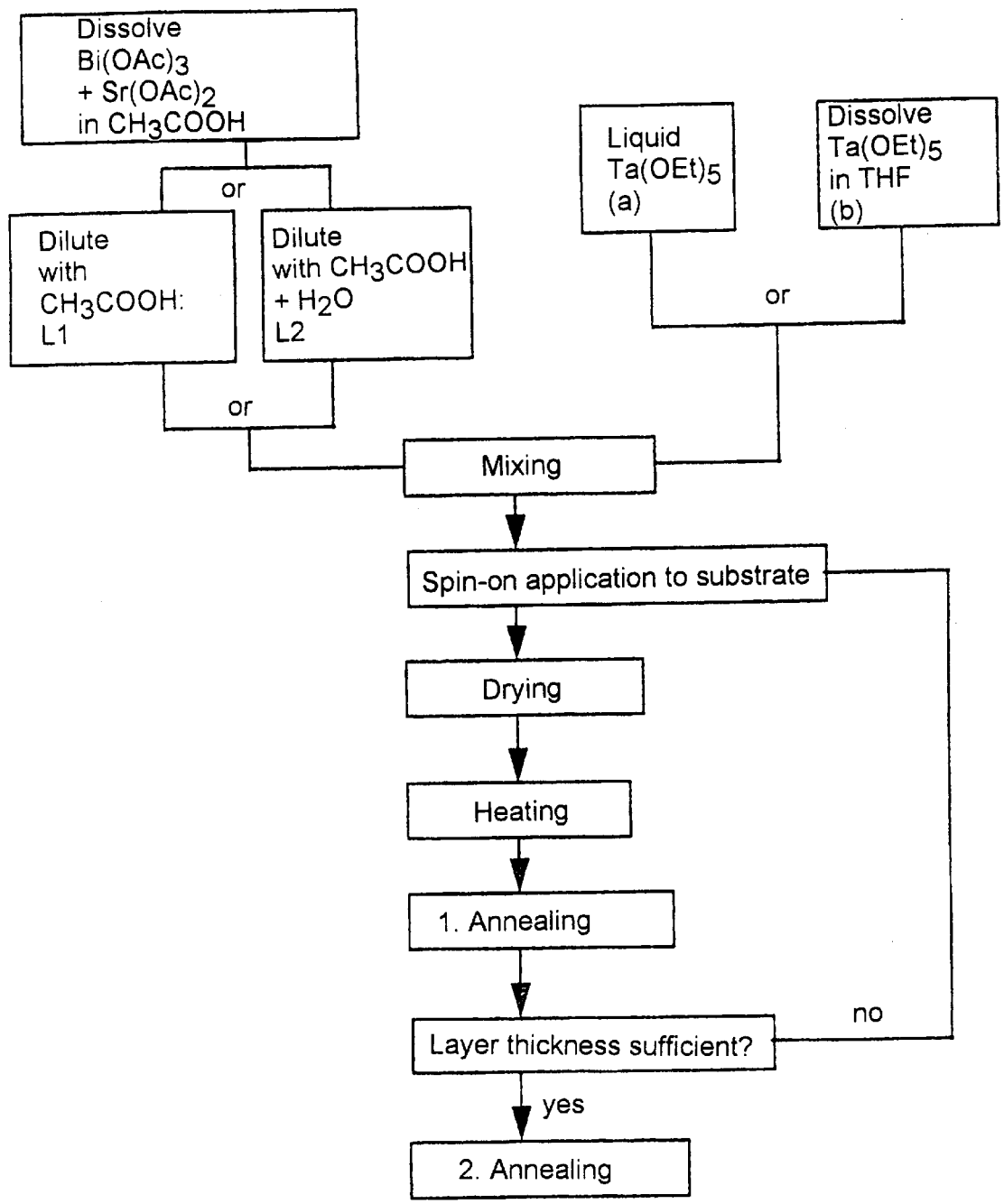

FIG. 2 shows a process flow chart of the second illustrative embodiment:

2.552 g of $Bi(OAc)_3$ and 1.451 g of $Sr(OAc)_2$ are dissolved in 13.880 g of acetic acid, preferably while heating. After the precursors have been dissolved, the solution may be diluted with further acetic acid. For example, 41.64 g of acetic acid may be added. A solution L1 which is obtained in this way is stable. In order to increase the long-term stability further, water may also be added to this solution, for example a 2 g quantity of water may be added to obtain a solution L2. The precursor containing Ta may be added to it either in the liquid state in a variant (a) or in the dissolved state in a variant (b), as follows:

(a) $Ta(OEt)_5$ is preferably used as the precursor containing Ta, since this is a simple compound having a relatively low melting point (about 30° C.). The solution and the Ta precursor are stored separately. They are mixed together immediately before the coating, with the precursor containing Ta being used in the liquid state. During the mixing process, the Ta precursor is intimately mixed, directly as a liquid, together with the solution L1 or L2, for example in a nozzle of a mixer. If necessary, the mixer should be heated so that the Ta precursor is kept liquid. The mixture is produced from the aforementioned amounts of the solution L1 or L2 and 2.66 g of precursor containing Ta. The mixture is then applied to the substrate in a spin-on process.

(b) $Ta(OEt)_5$ is again used as the precursor containing Ta, and is dissolved in a solvent, for example in tetrahydrofuran (THF). 2.66 g of $Ta(OEt)_5$ are dissolved in 5 g (about 6 ml) of THF.

If the mixture is produced from the solution L2 containing water and the Ta precursor according to variant (a) or the Ta precursor solution according to variant (b), it is important that the mixing take place quickly, in order to reduce the concentration of the precursor containing Ta rapidly, and thus to prevent coagulation of the hydrolysis product. This is especially true of variant (a), since in the case of variant (b) the precursor is already diluted. The time which elapses before the components have been intimately mixed together, especially in the case of variant (a), is preferably less than one second.

After application to the substrate and spinning, the layer is firstly dried, for example for 5 min at 150° in air. It is then heated for about 10 min to 290° in a normal atmosphere (prebake) and then annealed for 10 min at about 750° in air. It is, however, also possible for a one-stage annealing step to be used. In this way, an about 40 nm thick SBT layer is obtained. In order to produce larger layer thicknesses, the described procedure may be repeated. Once the desired layer thickness has been obtained, a final heat treatment step may then be carried out (for example 800° C./1 h/$O_2$).

The process according to the invention may also be carried out with propionic acid and propionates instead of acetic acid and acetates. In order to produce an SBT layer, Bi propionate and Sr propionate are used, and propionic acid ($C_2H_5COOH$) is used as the solvent. Methanoic acid and its salts may further be used.

It is further possible to produce other ceramic layers by using the process according to the invention. Acetic acid is preferably used as the solvent for the precursor containing Bi and, where appropriate, further precursors, but methanoic acid or propionic acid, respectively diluted with water if appropriate, may also be used. The suitable precursors can be determined by simple experiments, and in particular the group of substances including acetates or propionates, ethoxides, acetyl acetonates, simple organic salts of the required metals, their oxides or the metals themselves (for example the dilution of Sr metal in acetic acid) may be considered. The essential criteria for the selection are the properties of the respective compound which are known to the person skilled in the art, the availability on the market, the obtainable purity and safety. The quantity ratios between the precursors and the solvents can likewise be determined by simple experiments according to the thickness achieved and the structure of the layer.

Figure 3:
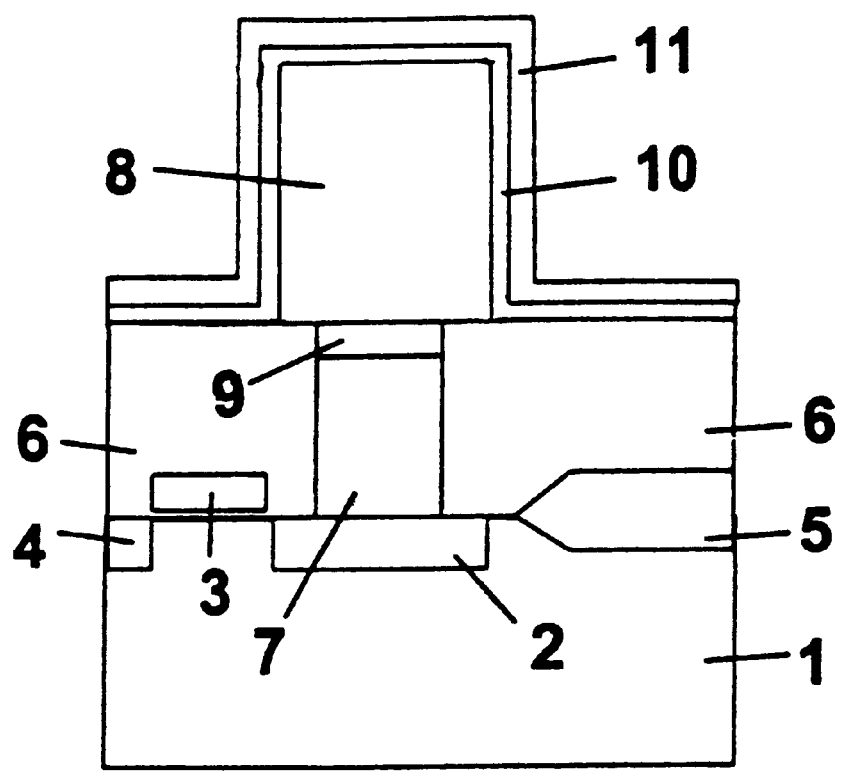
FIG. 3 is a cross-sectional view of a FRAM storage cell, as an example of an integrated semiconductor structure having a layer produced according to the invention.

The process can, in particular, be used during the production of a capacitor in an integrated circuit, for example in a DRAM or FRAM memory. An example of a memory of this type is represented in FIG. 3. An MOS transistor having doped regions 2, 4 and a gate 3 is produced in an Si semiconductor substrate 1 and is separated by an insulation region 5 from a transistor of a neighboring storage cell. The configuration is covered with an insulation layer 6. The doped region 2 is connected through a connection structure 7, for example made of W or polySi, and through the insulation layer 6, to a first electrode 8 of a storage capacitor. A barrier layer 9 for preventing $O_2$ diffusion (for example TiN) may be disposed below or on the first electrode. The structure which is produced so far then forms the substrate to which a ceramic layer 10 containing Bi, in particular a ferroelectric SBT layer, is applied as a storage dielectric using the process according to the invention. The storage cell is completed by a second electrode 11.

What is claimed is:

1. In a process for producing a SBT (strontium bismuth tantalate) layer containing Bi and Sr as components, the improvement which comprises:

using an organic acid $C_nH_{2n+1}COOH$, where n=0, 1 or 2 as a solvent for a precursor containing Bi and a precursor containing Sr;

providing a Ta precursor;

dissolving the precursors containing Bi and Sr in the organic acid solvent and dissolving the Ta precursor; and applying the dissolved precursors containing Bi, Sr, and Ta to the substrate; and then producing the layer by heating.

2. The production process according to claim 1 wherein water is used as a further solvent.

3. The production process according to claim 2, which comprises dissolving all of the precursors at the same time in the same organic acid.

4. The production process according to claim 1, which comprises dissolving the Ta precursor in tetrahydrofuran (THF).

5. The production process according to claim 1, which comprises using a salt of an organic acid, oxide, ethoxide or methoxide as Bi and Sr precursors.

6. The production process according to claim 1, which comprises using $Bi(OAc)_3$ and $SR(OAc)_2$ as precursors and using acetic acid as a solvent.

7. The production process according to claim 1, which comprises:

dissolving the precursor containing Bi and the precursor containing Sr in acetic acid to form a solution and heating to a temperature lying above the melting point of the precursor containing Ta;

mixing the precursor containing Ta in a liquid state with the solution to form a mixture; and applying the mixture to the substrate.

8. The production process according to claim 1, which comprises:

dissolving the precursor containing Bi and the precursor containing Sr in acetic acid;

dissolving the precursor containing Ta in THF;

then mixing the precursors to form a mixture; and applying the mixture to the substrate.

9. The production process according to claim 7, which comprises diluting the acetic acid solution with water, and carrying out the mixing in a time period lasting at most 1 sec.

10. The production process according to claim 8, which comprises diluting the acetic acid solution with water, and carrying out the mixing in a time period lasting at most 1 sec.

11. The production process according to claim 1, which comprises using $Bi(OAc)_3$ and $Sr(cybu)_2(H_2O)_2$ as precursors and using acetic acid as a solvent.

* * * * *